United States Patent [19]
Kajimoto

[11] Patent Number: 5,557,193
[45] Date of Patent: Sep. 17, 1996

[54] STABILIZED VOLTAGE GENERATING CIRCUIT AND INTERNAL VOLTAGE DOWN CONVERTER AND A METHOD OF GENERATING AN INTERNAL OPERATING POWER SUPPLY VOLTAGE FOR A DYNAMICALLY OPERATING CIRCUIT

[75] Inventor: Takeshi Kajimoto, Hyogo, Japan

[73] Assignee: Mitsubishi Denki Kabushiki Kaisha, Tokyo, Japan

[21] Appl. No.: 126,764

[22] Filed: Sep. 27, 1993

[30] Foreign Application Priority Data

Oct. 12, 1992 [JP] Japan ................................. 4-272775

[51] Int. Cl.⁶ .............................. G05F 1/40; G05F 1/44
[52] U.S. Cl. ................................. 323/282; 323/266
[58] Field of Search ........................... 323/265, 266, 323/282, 285, 286, 287, 312, 313, 314; 327/535, 538, 544

[56] References Cited

U.S. PATENT DOCUMENTS

| | | | |
|---|---|---|---|
| 4,928,056 | 5/1990 | Pease | 323/314 |
| 5,036,269 | 7/1991 | Murari et al. | 323/266 |
| 5,357,416 | 10/1994 | Kitano et al. | 323/313 |

OTHER PUBLICATIONS

JP 4-17190 A; In: Patents Abstracts of Japan; P-1344, vol. 16, No. 175, Apr. 27, 1992.
Tietze, U./Schenk, CH.: "Halbleiter-Schaltungstechnik", Springer-Verlag, Berlin, 3rd. edit., 1974, pp. 191-197.
"A Tunable CMOS-DRAM Voltage Limiter with Stabilized Feedback Amplifier", M. Horiguchi et al., IEEE Journal of Solid-State Circuits, vol. 25, No. 5, Oct. 1990, pp. 1129-1135.
"0.5 um . . . 16 M DRAM", Nikkei Micro-Device, Feb. 1990, pp. 115-122.

Primary Examiner—Matthew V. Nguyen
Attorney, Agent, or Firm—Lowe, Price, LeBlanc & Becker

[57] ABSTRACT

A method and an apparatus of an internal voltage down converter having good transient response characteristics and small chip real estate, includes a differential amplifier for comparing a voltage on an internal power supply line with a reference voltage, a MOS transistor for generating an internal supply voltage from an external supply voltage, by receiving the output of the differential amplifier at the gate, and a feed back capacitive element provided between the internal power supply line and the gate of the MOS transistor.

9 Claims, 6 Drawing Sheets

5,557,193

STABILIZED VOLTAGE GENERATING CIRCUIT AND INTERNAL VOLTAGE DOWN CONVERTER AND A METHOD OF GENERATING AN INTERNAL OPERATING POWER SUPPLY VOLTAGE FOR A DYNAMICALLY OPERATING CIRCUIT

BACKGROUND OF THE INVENTION

1. Field of the Invention

The invention relates to a circuit for generating a reference voltage in a semiconductor device and particularly to an internal voltage down converter which produces an internal supply voltage by down-converting an external supply voltage. More particularly, the invention relates to an internal voltage down converter in a dynamic type semiconductor memory device.

2. Description of the Background Art

A semiconductor memory device as a semiconductor device has become highly dense and integrated as its memory capacity increases. These high density and high integration are implemented by way of a micronization technology.

In contrast, the progress of micronization of an LSI (Large Scale Integrated) circuit such as a microprocessor, which determines a system supply voltage, is behind that of semiconductor devices. Thus, as supply voltage of a semiconductor device, 5 V for example is employed, and sufficiently low voltage is not utilized as a supply voltage.

Since components in the semiconductor device are micronized (the design rule is equal to or less than 0.6~0.5 μm, for example) by way of micronizing technology, when an externally applied supply voltage is provided to each component as an operating supply voltage, the reliability such as a break-down voltage of an insulating film of MOS transistors as the components cannot be ensured sufficiently. Therefore, in a memory device, such as a DRAM (Dynamic Random Access Memory) having the storage capacity of 16M bits or more, the reliability of elements has been ensured by internally down-converting the external supply voltage.

FIG. 3 is a schematic block diagram illustrating an entire structure of a semiconductor device which is, for example, a dynamic random access memory (DRAM). In FIG. 3, the semiconductor memory device includes an internal voltage down converter 102 generating an internal supply voltage VDD by down-converting an external supply voltage Vcc applied on a power supply line 114 through a supply voltage node 110, an internal circuit 104 operating with the internal supply voltage VDD applied on an internal power supply line 116 from the internal voltage down converter 102 as its operating supply voltage and a circuit 106 using the external supply voltage Vcc on the external power supply line 114 as its operating supply voltage. The internal voltage down converter 102, the internal circuit 104 and the circuit 106 also receive the other supply voltage (hereinafter, simply referred to as a ground voltage) Vss applied on the other power supply line (hereinafter, referred to as a ground line) 118 through a node 112.

The circuit 106 using the external power supply includes a circuit carrying out data input and output. The internal circuit 104 includes a memory cell array. The circuit 106 using the external power supply may include a peripheral circuit. Alternatively, the peripheral circuit may be included in the internal circuit 104.

In general, the internal voltage down converter 102 generates the internal supply voltage VDD by down-converting the external voltage supply Vcc applied on the external power supply line 114. Thus, even though MOS transistor which is a component of the internal circuit 104 is micronized, the reliability of the element can be ensured, as the voltage applied on its gate insulating film is reduced.

FIG. 4 is a diagram showing a specific structure of a conventional internal voltage down converter. In FIG. 4, the internal voltage down converter 102 includes a VREF generation circuit for generating a prescribed reference voltage VREF from the external supply voltage Vcc, a differential amplifier 1 as comparison means for comparing the reference voltage VREF and the internal supply voltage VDD on the internal power supply line 116 and a p-channel MOS transistor 2 feeding a current on the internal power supply line 116 from external supply voltage Vcc in response to an output voltage VG of the differential amplifier 1. The differential amplifier 1 receives the internal supply voltage VDD on the internal power supply line 116 at its positive input, and the reference voltage VREF from the VREF generation circuit 13 at its negative input.

The internal supply voltage VDD from the internal voltage down converter is transferred to the internal circuit 104 in the semiconductor memory device. In FIG. 4, interconnection equivalent circuit 130 of the resistance and the capacitance associated with the internal power supply line 116 is shown together with an equivalent circuit 140 of the internal circuit 104.

The interconnection equivalent circuit 130 includes an interconnection resistance 4 which is connected in series with the internal power supply line 116 and interconnection capacitances 3 and 5 which are connected between the internal power supply line 116 and the ground potential (Vss).

In the internal circuit 104, a MOS transistor carries out a switching operation to charge and discharge an internal node. The charge and discharge are equivalent to charging and discharging a parasitic capacitance. For example, in a DRAM memory cell array, a bit line crossing the selected word line is charged/discharged during a sensing operation. This is equivalent to charging and discharging the capacitance of each bit line. In FIG. 4, such parasitic capacitance is shown as a capacitance 8.

The internal circuit equivalent circuit (load circuit) 140 further includes a load resistance 9 indicative of a constantly existing current path, and a p-channel MOS transistor 6 and n-channel MOS transistor 7 for charging and discharging the capacitance 8 in response to a control signal φ. The p-channel MOS transistor 6 charges the capacitance 8 to the internal supply voltage VDD level in response to the control signal φ. The n-channel MOS transistor 7 discharges the capacitance to the ground potential level in response to the control signal φ. The MOS transistors 6 and 7 operate complementarily. An operation of the internal voltage down circuit 102 will be described.

The p-channel MOS transistor 2 receives the external supply voltage Vcc at its source and supplies a current to the internal power supply line 116 in accordance with the voltage VG applied at the gate from the differential amplifier 1. The differential amplifier 1 generates the output voltage VG by differentially amplifying the reference voltage VREF generated from the VREF generation circuit 13 and the internal supply voltage VDD on the internal power supply line 116.

When the voltage level of the internal supply voltage VDD rises (VDD>VREF), the voltage level of the output voltage VG of the differential amplifier 1 rises and the conductance of p-channel MOS transistor 2 decreases to prevent the internal supply voltage VDD from increasing. In contrast, when the internal supply voltage VDD is decreased and becomes lower than the reference voltage VREF, the output voltage VG of the differential amplifier 1 becomes lower than the prescribed level and increases the conductance of the p-channel MOS transistor 2 and the current is supplied to the internal power supply line 116 to raise the internal supply voltage VDD.

That is, internal voltage down converter 102 feeds back the internal supply voltage VDD to compare the same with the reference voltage VREF and operates to retain the internal supply voltage to a constant voltage level (e.g. the reference voltage VREF level) by amplifying the comparation result to control a power supply driving p-channel MOS transistor 2.

Differential amplifier 1 must have a sufficiently fast response speed, since in the event that the feed back in the feed back loop cannot follow the change of the internal supply voltage VDD, the output voltage VG becomes oscillating state, which may, possibly cause the ripple voltage to be overlaid with the internal supply voltage VDD.

However, since internal power supply line 116 was disposed over whole internal circuit 104, it has been considered that internal supply voltage VDD was smoothed by interconnection resistance 4 and interconnection capacitances 3 and 5, that such ripple voltage could be sufficiently suppressed and that the constant voltage level internal supply voltage VDD could be generated stably also against the transient current. In other words, since the feed back delay of the differential amplifier 1 was sufficiently smaller than an RC time constant of interconnection equivalent circuit 130, it has been considered that the aforementioned ripple voltage could be suppressed reliably (see Nikkei Micro-Device, February, 1990, pp. 115–122).

In internal equivalent circuit (load circuit) 140, when falling the control signal φ to "L", the current flows from the internal power supply line 116 to charge capacitance 8. Whenever a capacitive load is driven, phase difference between the load current and the internal supply voltage VDD occurs. (See the relation of I=C·dV/dt). This load current which flows into the capacitance 8 is supplied via MOS transistor 2 included in internal voltage down converter 102. The current flowing through MOS transistor 2 corresponds to its gate voltage, i.e., output voltage VG of differential amplifier 1. Therefore, the occurrence of the phase difference between the internal supply voltage VDD and the load current is equivalent to the existence of the phase difference between the output voltage VG of differential amplifier 1 and the internal supply voltage VDD. Thus, a delay occurs in the feed back loop included in internal voltage down converter 102, the change of the output voltage VG of differential amplifier 1 is delayed, compared with the change of the internal supply voltage VDD and as shown in FIG. 5, and there occurs a problem that the internal supply voltage VDD vibrates.

FIG. 5 shows the variations of the output voltage of differential amplifier of internal voltage down converter 102 and the internal supply voltage VDD, where ordinate indicates voltage and abscissa indicates time. The circuit simulation is performed assuming the capacitance value of capacitance 8 as 100 pF, the external supply voltage Vcc as 5 V and the reference voltage VREF as 3 V. The resistance value of resistance 9 is about 100Ω.

If the internal supply voltage VDD vibrates, internal circuit 104 cannot operate stably (signal potential variation), which causes the problem of not being able to operate at a high speed (because it is necessary to wait until the signal becomes stable.)

In order to solve the problem of the vibration during a high speed switching operation of the internal supply voltage VDD, Horiguchi et al. have proposed a structure in which a phase compensation circuit 150 having resistance 10 and large capacitance 11 connected in series is provided as a circuit compensating for such a phase difference (IEEE Journal of Solid-State Circuits, Vol. 25, No. 5, October 1990 pp. 1129–1135). In the aforementioned work, Horiguchi et al. have attempted to improve the frequency response characteristics by providing phase compensation circuit 150 to eliminate a pole of differential amplifier 1 and to eliminate the feed back loop (a path of output of transistor 2-internal power supply line-differential amplifier-gate of transistor 2) to increase the phase margin.

However, even though such phase compensation circuit is provided, it cannot completely eliminate the phase difference between the current flowing in transistor 2 and the internal supply voltage VDD during a high speed switching operation, and the change of the output voltage VG of differential amplifier 1 is inevitably delayed behind the change of the internal supply voltage VDD. The satisfactory response characteristics cannot be obtained from the result of the circuit simulation.

In the structure generating reference voltage such as the internal supply voltage with the circuit constituting aforementioned feed back loop, where a load capacitance performs a dynamic operation (an operation including charging and discharging), internal reference voltage cannot be generated stably.

Also, it is difficult to optimize the internal voltage down converter for preventing vibration of the internal reference voltage, since the capacitance value of capacitance (load capacitance 8) associated with internal power supply line 116 differs when internal circuit 104 is in operation than when it is in stand-by.

SUMMARY OF THE INVENTION

One object of the invention is to provide a reference voltage generation circuit having good transient characteristics.

Another object is to provide an internal voltage down converter in a semiconductor memory device, which can supply an internal supply voltage stably.

Still another object is to provide an internal voltage down converter having good transient characteristics, which can recover the internal supply voltage to a desired level at high speed, even when the capacitance load carries out switching operation at high speed.

The stabilized voltage generation circuit of the invention includes comparator means comparing a voltage on an output node with a reference voltage, adjusting means for adjusting current amount flowing from a voltage supplying node into the output node in response to the output of said comparator means, and circuitry coupled between the output node and the output of the comparator means, for feeding back a potential change on the output node to the output of comparator means by capacitive coupling. A voltage on the output node is provided to a circuit portion carrying out dynamic operation.

The internal voltage down converter of the invention includes differential amplification means for amplifying the difference between the reference voltage and the voltage on the internal power supply node (a second node), an insulated gate type field effect transistor having, one conducting terminal connected to a first node receiving external supply voltage, the other conducting terminal connected to the internal power supply node and its gate receiving the output of the differential amplification means and a feed back capacitive element disposed between the internal power supply node and the output of the differential amplification means. The internal power supply voltage on the internal power supply node is applied at least to a memory array portion.

In the stabilized voltage generation circuit, the feed back means conveys the potential change on the output node directly to the output of comparator means without delay. Thus the current amount fed to the output node is adjusted instantly in accordance with the potential change on the output node, and the potential change on the output node is reliably compensated for.

In the internal voltage down converter, the change of the internal supply voltage during internal circuit operation is conveyed to the gate of the insulated gate type field effect transistor without delay by the feed back capacitive element, so that the potential change can be compensated for quickly and reliably, and the transient response characteristics of the internal voltage down converter is improved.

The present invention provides a method of generating an internal operating power supply voltage for a dynamically operating circuit. This method comprises the steps of supplying a current flow from a first node receiving an external supply voltage to an internal supply voltage line for supplying the internal operating power supply voltage. The reference voltage of a predetermined level is compared with the voltage on the internal supply voltage line. In response to a result of comparison in the step of comparing, an amount of current flowing from the first node to the internal supply voltage line is adjusted so as to reduce the difference between the reference voltage and the voltage on the internal supply voltage line. The voltage on the internal supply voltage line is fed back through a capacitive coupling element to combine the fed-back voltage with the result of comparison. In certain embodiments, the step of comparing includes the step of analogue and differentially amplifying the difference.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
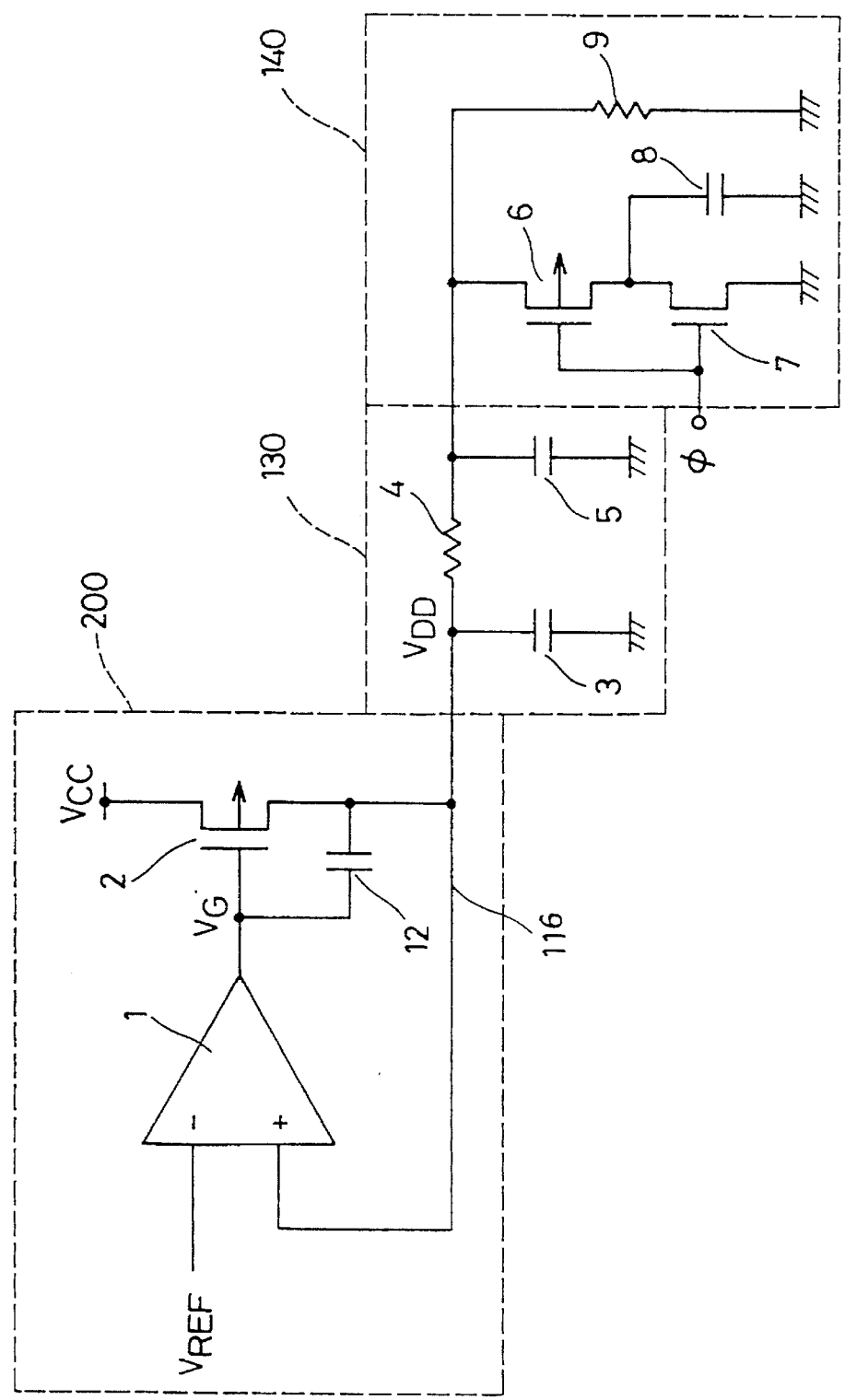
FIG. 1 shows a specific structure of an internal voltage down converter according to one embodiment of the present invention.

FIG. 1 shows a specific structure of an internal voltage down converter according to one embodiment of the present invention. In FIG. 1, the internal voltage down converter includes a feed back capacitive element 12 provided between an output node of a differential amplifier 1 and an internal power supply line 116. The feed back capacitive element 12 conveys the potential change on internal power supply line 116 to the output node of differential amplifier 1 by its capacitive coupling. The feed back capacitive element 12 is set such that its capacitive value is equal to or larger than the gate capacitance of a MOS transistor 2. This is to cause the potential change on the internal power supply line 116 to be reliably conveyed with sufficient magnitude to the output node of the differential amplifier 1 in a capacitance circuit which is formed by the gate capacitance of the MOS transistor 2 and the capacitance of feed back capacitance element 12. The output capacitance of the differential amplifier 1 is negligible as compared with the capacitance of feed back capacitance element 12.

An amplification factor of the differential amplifier 1 is set to such a value that it produces in its output voltage VG about the same level of potential change as the potential change on internal power supply line 116.

As for differential amplifier 1, parameters of components including MOS transistor 2 may be set such that a voltage gain is approximately 1. Transient control ability by feed back capacitive element 12 and steady control ability may be made substantially equal to each other.

Figure 3:
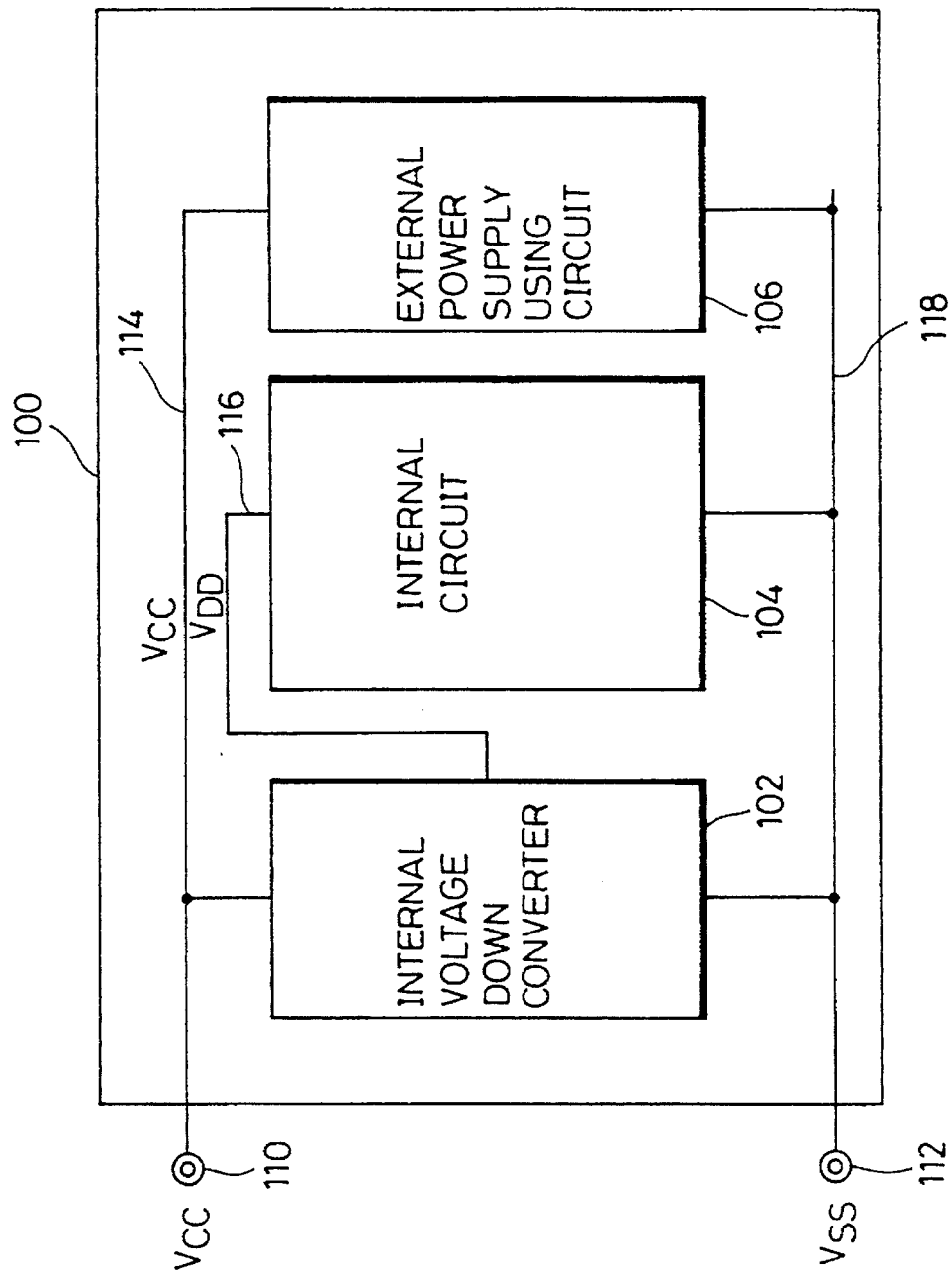
FIG. 3 is a schematic block diagram showing the whole structure of the semiconductor memory device to which the present invention is applied.
Figure 4:
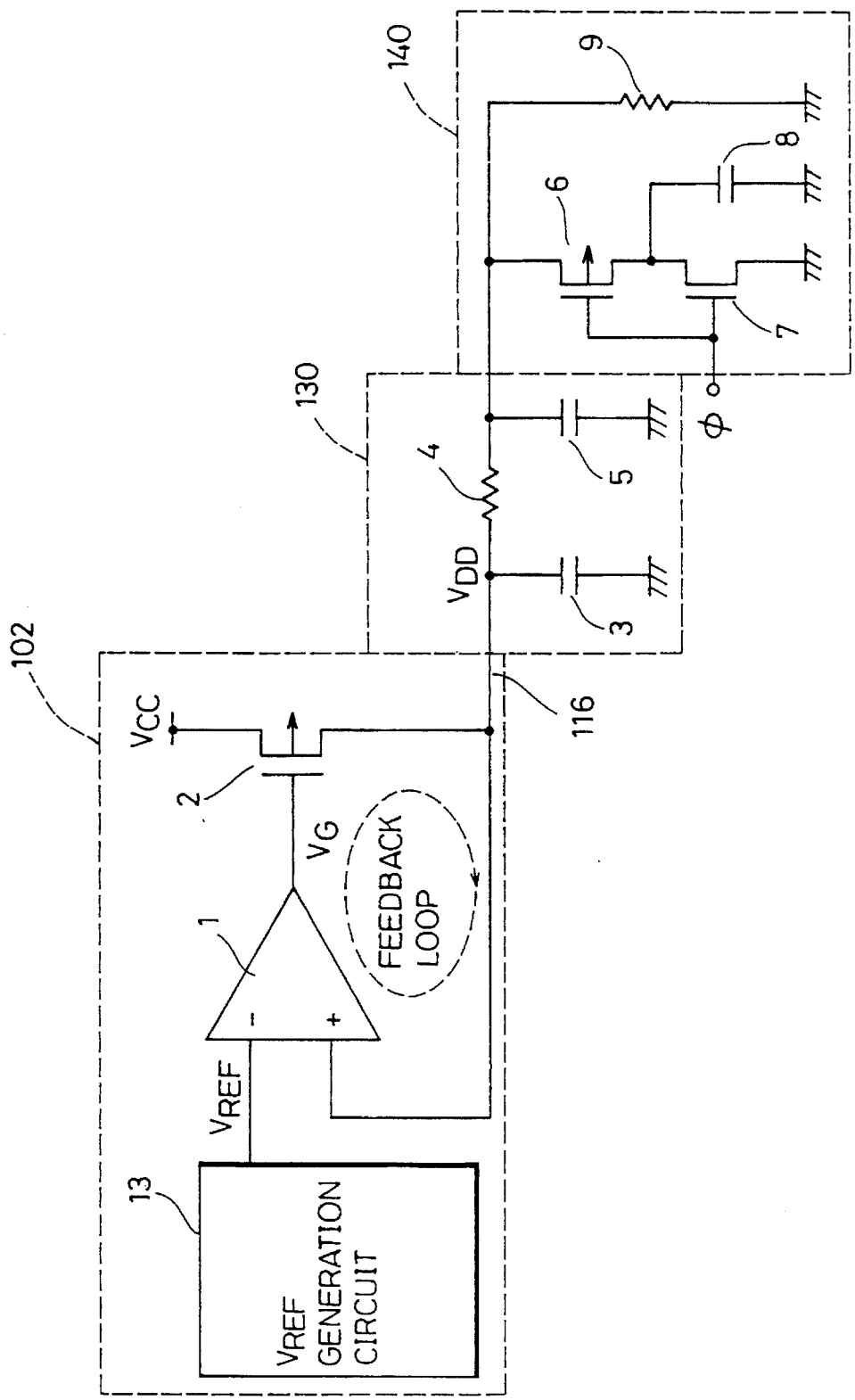
FIG. 4 shows a structure of a conventional internal voltage down converter.
Figure 5:
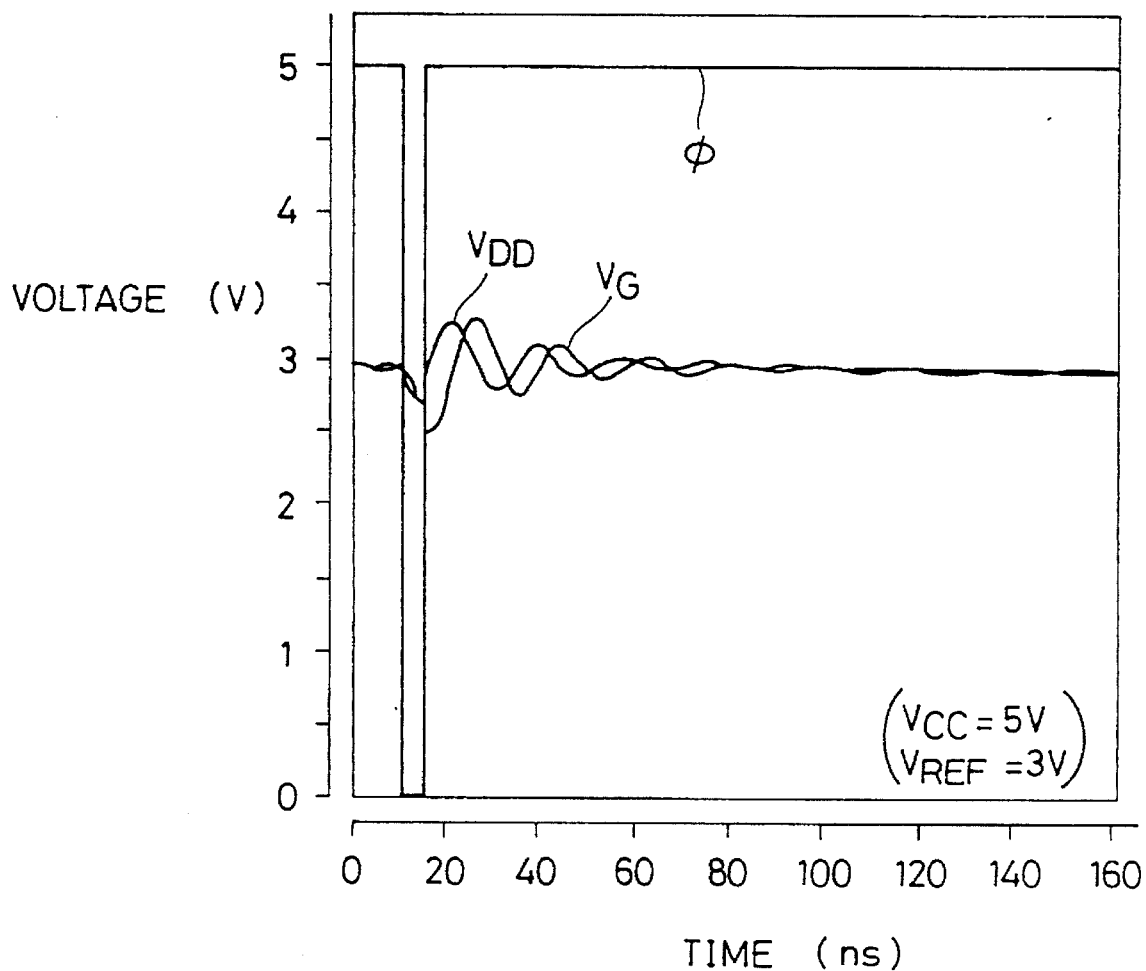
FIG. 5 shows a results found by simulating the operation characteristics of the internal voltage down converter shown in FIG. 4.
Figure 6:
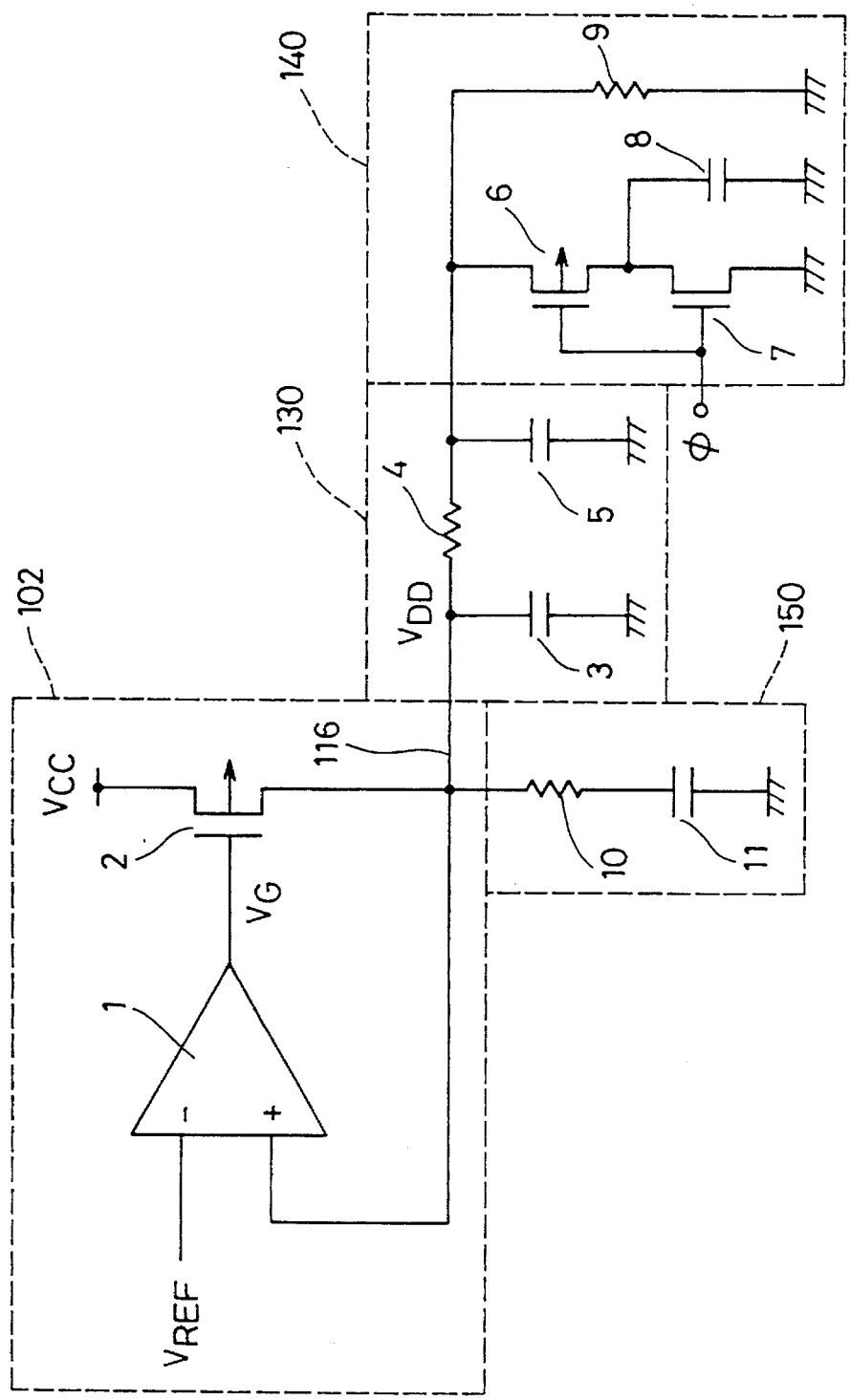
FIG. 6 shows a modified example of the conventional internal voltage down converter.

An interconnection equivalent circuit 130 representing resistance and capacitance of the internal power supply line 116 and a load circuit 140 representing an internal circuit have same structures as those shown in FIGS. 4 and 6. A capacitive load (such as a bit line load capacitance) performing a high speed switching operation in internal circuit 104 (see FIG. 3) is represented by MOS transistors 6 and 7 and load capacitance 8, while a constant current path is represented by a load resistance 9. Operation thereof will be described.

Differential amplifier 1 normally compares reference voltage VREF (generated from the same circuit structure as VREF generation circuit shown in FIG. 4) with internal supply voltage VDD on internal power supply line 116. If If the internal supply voltage VDD is higher than reference voltage VREF, the level of the output voltage VG of differential amplifier 1 rises and the conductance of MOS transistor 2 decreases. Thus, the current amount flowing from the output power supply Vcc through MOS transistor 2 onto internal power supply line 116 decreases and the increase of the internal supply voltage VDD is prevented.

Conversely, if the internal supply voltage VDD is lower than the reference voltage VREF, the level of the output voltage VG of differential amplifier 1 lowers, the conductance of MOS transistor 2 increases, current supply amount increases and the internal supply voltage VDD increases.

By the aforementioned feed back control, the internal supply voltage VDD is controlled to be approximately the same voltage level as the reference voltage VREF. This constant control is the same as in a conventional one.

When a control signal φ falls instantly to "L" and MOS transistor 6 carries out a high speed switching operation, a load current flows from internal power supply line 116 through MOS transistor 6 into load capacitance 8. This load current is supplied via MOS transistor 2. When the load current flows rapidly to this load capacitance 8, the potential level of the internal supply voltage VDD on internal power supply line 116 rapidly lowers because of current supply. The lowering of the potential of the internal supply voltage VDD is conveyed to differential amplifier 1, i.e. the gate of MOS transistor 2 by feed back capacitive element 12. By this capacitive coupling of feed back capacitive element 12, the voltage VG similarly drops at high speed and MOS transistor 2 increases the supply current flow amount. That is, the drop of the potential of the internal supply voltage VDD is instantly conveyed to the MOS transistor 2 without delay, the current amount flowing through MOS transistor 2 is increased without delay, and the internal supply voltage VDD is increased. Conversely, if the internal supply voltage VDD increases due to the current from this MOS transistor 2, the increase of the potential of the internal supply voltage VDD is again conveyed via feed back capacitive element 12 to the gate of MOS transistor 2 and the supply current flow amount of the MOS transistor is decreased.

As described above, since the potential change of the internal supply voltage VDD is conveyed to the gate of MOS transistor 2 without delay by feed back capacitive element 12 (transient control), faster response is possible at the transition when the internal circuit is operating, than that possible under the control of differential amplifier 1.

Figure 2:
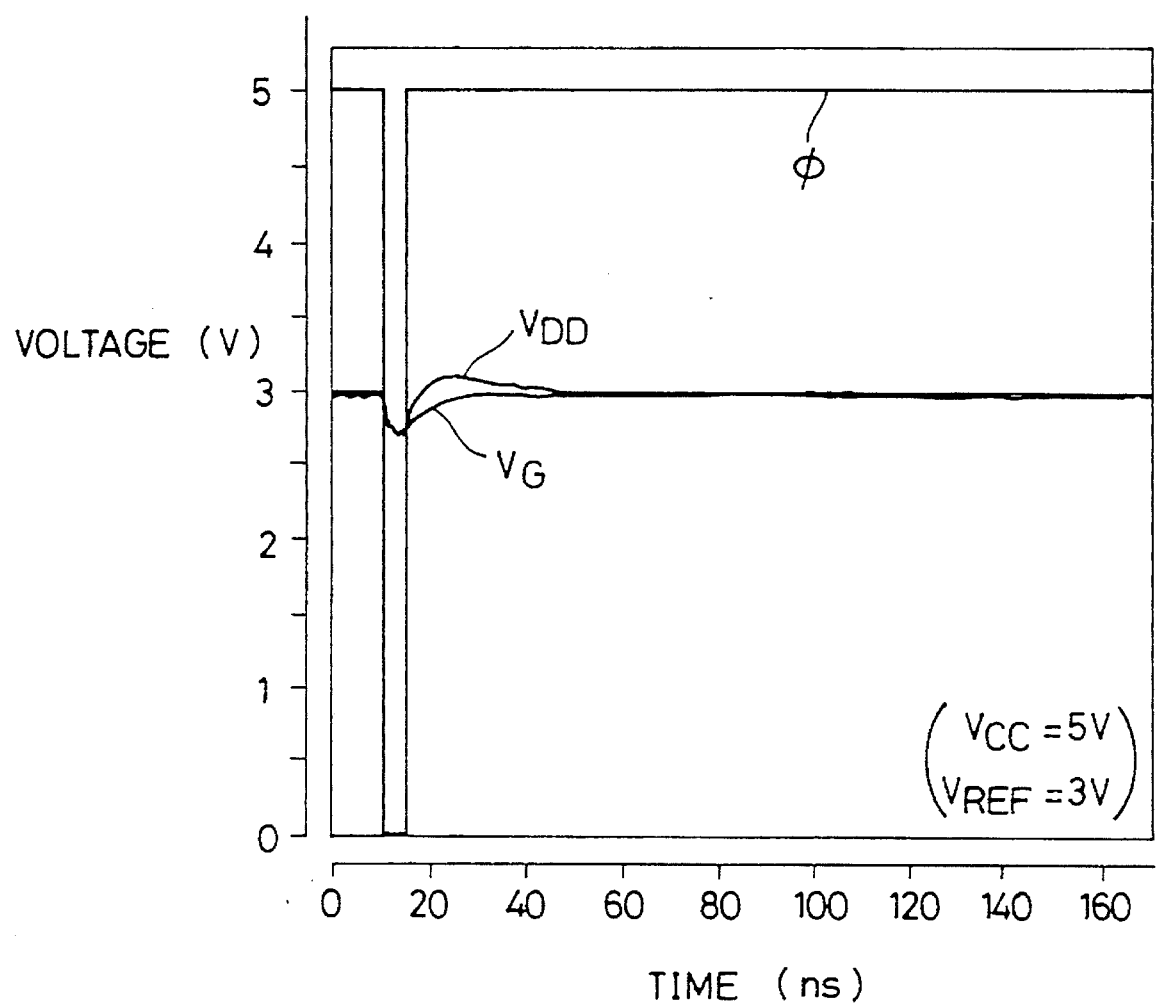
FIG. 2 shows results found by simulating the operation characteristics of the internal voltage down converter shown in FIG. 1.

FIG. 2 shows results found by simulating control characteristics of an internal voltage down converter according to an embodiment of the present invention. In FIG. 2, ordinate indicates the voltage and abscissa indicates time (in nano second). The circuit parameter values utilized in simulation are as follows.

External supply voltage Vcc: 5 V,

Reference voltage VREF: 3 V,

Gate width/Gate length (W/L) of MOS transistor 2: 2500/1 (in μm)

Capacitance value of capacitances 3, 5 and 8: 100 pF,

Resistance value of resistance 4: 10Ω

Resistance value of resistance 9: 100Ω

Capacitance of feed back capacitive element 12: 5 pF

Gate width/Gate length of MOS transistor 6: 1000/0.6 (in μm)

Gate width/Gate length of MOS transistor 7: 500/0.6 (in μm).

As is obvious from the simulation results shown in FIG. 2, owing to the provision of feed back capacitive element 12, the phase difference between gate voltage VG of MOS transistor 2 and the internal supply voltage VDD (internal power supply VDD and load current) disappears and the internal supply voltage VDD rapidly converges on a prescribed value without vibration. By this feed back capacitive element 12, the feed back delay can be prevented as the potential change of the internal supply voltage VDD is directly transmitted to the gate of MOS transistor 2, the supply current amount of MOS transistor 2 can be adjusted at high speed without producing the phase difference (without delay), and an internal voltage down circuit having good transient response characteristics can be implemented. Thus, prescribed level of the internal supply voltage can be supplied stably even though the internal circuit carries out a switching operation at high speed.

Also, by setting a gain of differential amplifier 1 so as to provide the potential change of the output voltage VG of the same level as the potential change that feed back capacitive element 12 provides to the voltage VG for the same potential change of the internal supply voltage, the constant control ability and the transient control ability by the feed back capacitive element can be substantially equal to each other and a stable internal voltage down converter having good frequency response characteristics can be implemented.

The improvement of the transient response characteristics of the feed back control in the internal voltage down converter of the semiconductor memory device is described in the above embodiment. However, the present invention is not limited to the internal voltage down converter of the semiconductor device but applicable to any circuit supplying a stabilized voltage of a constant voltage level to load circuit carrying out a dynamic operation (which carries out charging and discharging by switching operation).

Further, as for semiconductor device, it is not limited to a dynamic type semiconductor memory device (DRAM), it may be a static type semiconductor memory device, and it can be any device as far as it has a function to down-convert the external supply voltage. That is, the present invention is generally applicable to a circuit generating a stabilized voltage by way of feed back control.

As described above, according to the invention, since the potential change of the output node such as internal power supply node is conveyed via capacitive coupling to the output node of the differential amplifier as comparator means, a stable reference voltage generating circuit having good transient characteristics can be implemented. More specific effect can be summarized as follows.

(a) Because of the structure that the voltage on the output node is fed back via capacitive coupling to the output node of the comparator means by feed back means, the phase difference between the load current and the output voltage can be eliminated. A stabilized voltage generating circuit having good transient characteristics which can set the output voltage back to the prescribed value at high speed can be implemented.

(b) Because a feed back capacitive element is provided between the internal power supply node and the gate of insulated gate type field effect transistor, the potential change of the internal supply voltage during internal circuit operation can be conveyed without delay to the gate of the insulated gate type field effect transistor. Feed back control structure having good frequency response characteristics and having good loop stability can be implemented, and an internal voltage down converter which can supply a stable internal supply voltage in a semiconductor memory device can be obtained.

(c) Both the feed back means and the feed back capacitive element can employ capacitive elements of a small capacitance value (the parasitic capacitance of the output of the differential amplifier as a comparator means is small), which in comparison with an arrangement and a phase compensation circuit of having an additional smoothing capacitance requiring large capacitance (e.g. several hundreds pF) or requiring large capacitance value to keep at a constant level the supply voltage to the load circuit by charging operation, makes it possible to reduce the layout area thereof significantly.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A stabilized voltage generating circuit, comprising:

comparator means for comparing a voltage on an output node of the stabilized voltage generating circuit with a first reference voltage;

adjusting means, coupled to the comparator means, for adjusting a current amount flowing from a voltage supplying node to said output node, in response to an output of said comparator means; and feed back means, coupled between said output node and the output of the comparator means, for feeding back a potential change on said output node to the output of said comparator means by capacitive coupling, wherein a voltage on said output node is applied to a circuit portion driven dynamically as an operating power supply voltage.

2. A voltage down converter for generating an internal supply voltage on a second node by down-converting an external supply voltage applied onto a first node in a semiconductor device, comprising:

a differential amplification means for differentially amplifying a prescribed reference voltage and a voltage on said second node;

an insulated gate type field effect transistor having one conducting terminal connected to said first node and another conducting terminal connected to said second node and a gate connected to receive an output of said differential amplification means;

a feed back capacitive element provided between said second node and the output node of said differential amplification means, wherein a voltage on said second node of said internal voltage down converter is utilized to drive a dynamically operating circuit.

3. The converter according to claim 2, wherein a gate capacitance of said insulated gate type field effect transistor is equal to or smaller than a capacitance of said feed back capacitive element.

4. The converter according to claim 2, wherein a feed back loop formed by said field effect transistor and said differential amplifier means provides a unit gain feed back loop.

5. The converter according to claim 2, wherein said differential amplifier means has a negligible output capacitance as compared to said feed back capacitance.

6. The converter according to claim 2, wherein said dynamically operating circuit includes memory cells arranged in an array.

7. The converter according to claim 2, wherein said semiconductor device comprises a dynamic random access memory.

8. A method of generating an internal operating power supply voltage for a dynamically operating circuit, comprising the steps of:

supplying a current flow from a first node receiving an external supply voltage to an internal supply voltage line for supplying said internal operating power supply voltage;

comparing a reference voltage of a predetermined level with a voltage on said internal supply voltage line;

in response to a result of comparison in said step of comparing, adjusting an amount of current flow flowing from said first node to said internal supply voltage line so as to reduce a difference between the reference voltage and the voltage on said internal supply voltage line; and feeding back the voltage on said internal supply voltage line through a capacitive coupling element to overlay the fed-back voltage onto the result of comparison.

9. The method according to claim 8, wherein said step of comparing includes the step of analoguely and differentially amplifying said difference.

* * * * *